Feb. 7, 1967 R. R. HAERING ET AL 3,303,067

METHOD OF FABRICATING THIN FILM TRANSISTOR DEVICES

Filed Dec. 26, 1963 2 Sheets-Sheet 1

INVENTORS
RUDOLPH R. HAERING
MARK G. MIKSIC
WILLIAM B. PENNEBAKER

BY S. P. Tedesco
ATTORNEY

United States Patent Office 3,303,067
Patented Feb. 7, 1967

3,303,067
METHOD OF FABRICATING THIN FILM TRANSISTOR DEVICES

Rudolph R. Haering, Kitchener, Ontario, Canada, and Mark G. Miksic, Yorktown Heights, and William B. Pennebaker, Ossining, N.Y., assignors to International Business Machines Corporation, New York, N.Y., a corporation of New York Filed Dec. 26, 1963, Ser. No. 333,406
1 Claim. (Cl. 148—174)

This invention relates to improved methods of fabricating electrical circuit components of the field-effect type.

Due to the increased complexity of present day electronic systems and the objectionable high costs of fabricating the same, considerable effort is being directed toward the development of new solid state devices suitably adapted for batch-fabrication techniques. By batch-fabrication is meant that active components as well as electrical interconnections therebetween to form a circuit arrangement are fabricated concurrently on a single substrate surface. A new solid state device has been recently described in the scientific literature, for example, by P. K. Weimer, "The TFT—A New Thin-Film Transistor," Proceedings of the IRE, June 1962. The operation of this new solid state device, described as a field-effect device, closely approximates that of a conventional vacuum triode since "working currents" are supported only by majority carriers. It differs from the conventional "field-effect" transistor as described, for example, by W. Shockley, "A Unipoplar Field Effect Transistor," Proceedings of the IRE, pages 1365 through 1376, November 1962, in that a metal electrode spaced from the semiconductor by a thin dielectric film defines the control gate in lieu of a reverse-biased "pn" junction.

Basically, the thin film transistor as described by Weimer, supra, comprises a narrow channel of wide-band gap semiconductor material deposited between metallic source and drain electrodes; in addition, a control gate electrode insulated from the semiconductor, or active, layer by a thin dielectric film is registered with the source-drain gap. Flow of majority carriers through the semiconductor layer and between the source and drain electrodes is modulated by bias voltages applied to the control gate. In effect, the control gate and the active layer form a capacitor such that carrier concentration in the active layer is a function of control gate bias. Since the semiconductor active layer can be polycrystalline, thin film transistors and, also, interconnections between the devices themselves to form particular circuit arrangements can be formed by standard vapor deposition techniques onto a single substrate.

Thin film transistors are operative in either a depletion mode or an enhancement mode. The depletion mode is distinguishable in that useful source-drain current along the active layer is had with zero or negative control gate bias; conversely useful source-drain current in the enhancement mode is had only with positive control gate bias. Since the control gate is insulated from the active layer, it can be biased either for enhancement mode or depletion mode operation without drawing appreciable control gate current. For the majority of circuit applications, however, the enhancement mode is preferred so as to permit direct coupling between successive thin film transistor stages. Generally, thin film transistors fabricated by vapor deposition techniques and without special treatment of the active layer exhibit depletion mode operation.

Thin film transistor operation is based on the modulation of majority carrier volume density in the active layer by electrical fields generated by the control gate bias. When the control gate is biased, majority carriers are drawn into the active layer from the source and drain electrodes whereby carrier concentration and, hence, conductivity at the surface of the active layer increases. The modulation efficiency of a thin film transistor for a constant gate capacitance, can be defined by the ratio of $\Delta\sigma/\sigma=\Delta n_c/n_c+\Delta\mu/\mu$, where $\sigma$ is the conductivity of the active layer material, $n_c$ is the mobile majority carrier density per unit area of the active layer surface, $\mu$ is the mobility of the majority carrier, and the $\Delta$- factors are the change in these quantities per unit change in control gate bias. To obtain operation in the enhancement mode, the ratio $\Delta n_c/n_c$ should be much greater than unity; residual carrier density $n_c$ can be reduced so as to improve this ratio by forming the active layer of wide-band gap semiconductor material. In addition, this ratio would be improved if change in carrier density $\Delta n_c$ is correspondingly increased. Transconductance $g_m$ of the thin film transistor, defined as $dI_{sd}/dV_g$, where $I_{sd}$ is source-drain current and $V_g$ is control gate voltage, can be defined as a function of change in carrier density $\Delta n_c$. Such statements can be appreciated if one considers that the quantity $\Delta n_c$ is indicative of the increased number of majority carriers in the conduction band defined at the active layer-insulating layer interface per unit change in gate bias.

An object of this invention, therefore, is to provide a thin film transistor device operable in the enhancement mode.

Another object of this invention is to provide an improved method for fabricating thin film transistor devices operable in the enhancement mode.

Another object of this invention is to provide a thin film transistor device having a controllable transconductance $g_m$.

Another object of this invention is to provide a thin film transistor wherein the change in carrier density $\Delta n_c$ per unit change in control gate bias is determined during the fabrication process so as to obtain desired operating characteristics in the enhancement mode.

These and numerous other objects and advantages of this invention are achieved by appropriate control of "traps" or impurity sites introduced into the active layer of the thin film transistor during the fabrication process. In accordance with the teachings of this invention, the stoichiometry of the active layer is controlled by compensating for vacancies during and/or subsequent to the deposition process to reduce the residual carrier density $n_c$. It should be understood that a certain number of crystalline defects are normally present in the active layer due to, for example, the presence of impurities in the semiconductor evaporant, absorption of residual gases present within the system, crystal boundaries, defects and vacancies in crystal structures, etc. These defects may give rise to energy states in excess of the Fermi level which tend to remain empty and limit carrier mobility. Further, these defects, which can be traps, limit change in carrier density $\Delta n_c$ in the active layer per unit change in control gate bias whereby the efficiency ratio $\Delta\sigma/\sigma$ is reduced.

While materials classified as conductors could theoretically form the active layer, the use of such materials is precluded since the residual carrier density $n_c$ is excessive; in such event, the effects of the control gate field are limited to within a few Angstroms of the active layer surface. The use of semiconductor materials for such purposes is preferred because of their reduced residual carrier density $n_c$ whereby the ratio $\Delta n_c/n_c$ is increased and a useable transconductance $g_m$ is obtained. While change in residual carrier density $\Delta n_c$ is a function of input capacitance and, also, control gate bias, the controlled compensation of vacancies in the active layer further reduces the residual carrier density $n_c$ so as to increase modulation efficiency; further, by proper regulation of the residual carrier density $n_c$, the transconductance $g_m$ and on-off ratio of the thin film transistor can be controlled. In effect, the introduction of impurity sites increases the difference between the conduction band and the Fermi level of the material forming the active layer.

In accordance with one aspect of this invention, the conductivity of the semiconductor layer is controlled by introducing particular impurity sites to reduce the residual carrier density $n_c$ in the active layer. For example, in a cadmium sulfide active layer wherein the majority carriers are electrons, acceptor-type dopant material is selected. Since the resulting impurity sites correspond to energy states below the Fermi level and exhibit affinity for residual electrons in the conduction band, the residual electron density $n_c$ in the active layer is reduced. Alternatively, in a lead sulfide active layer wherein the majority carriers are holes, donor-type dopant material is selected to reduce the residual hole density. Accordingly, the efficiency ratio $\Delta n_c/n_c$ and transconductance $g_m$ of the thin film transistor is not only increased but controlled in accordance with the number of impurity sites introduced.

In accordance with another aspect of this invention, similar effects are achieved by controlled compensation of the active layer to satisfy vacancies by depositing the semiconductor material in a gaseous atmosphere of desired composition. For example, when cadmium sulfide is deposited in an oxygen atmosphere, the oxygen dopant absorbed by the active layer compensates for sulfur vacancies and reduces the residual electron density $n_c$. This can be appreciated if one considers that each free cadmium atom, i.e., $Cd^{++}$, in the active layer unless satisfied, contributes a pair of free electrons to the conduction band. The oxygen atoms take the place of sulfur vacancies and essentially compensate for these vacancies by placing $O^{=}$ at sites which lack $S^{=}$. When residual electron density $n_c$ is reduced sufficiently, good "on-off" operation in the enhancement mode is obtained wherein useful source-drain currents are achieved by low control gate bias. Moreover, since resistance varies as a function of the residual carrier density $n_c$, such parameter can be monitored to ascertain the doping level of the active layer. Controlled compensation of the active layer, therefore, contributes to the modulation efficiency by decreasing residual carrier density $n_c$ and increases the transconductance $g_m$ by effecting an increase in the mobility $\mu$. While the principal effect of the introduction of impurity sites is to increase the modulation efficiency, its effect on the mobility $\mu$ is much smaller.

The foregoing and other objects, features, and advantages of the invention will be apparent from the following more particular description of preferred embodiments of the invention, as illustrated in the accompanying drawings.

FIGS. *4a*, *5a*, and *6a* illustrate the source-drain current $I_{sd}$-source-drain voltage $V_{sd}$ characteristics curves of a thin film transistor having an active layer which is undoped or underdoped, selectively doped, and overdoped, respectively.

In FIGS. *4b*, *5b*, and *6b*, the position of the Fermi level with respect to the conduction band illustrates the condition in undoped or underdoped, selectively doped, and overdoped active layers, respectively.

Figure 1:
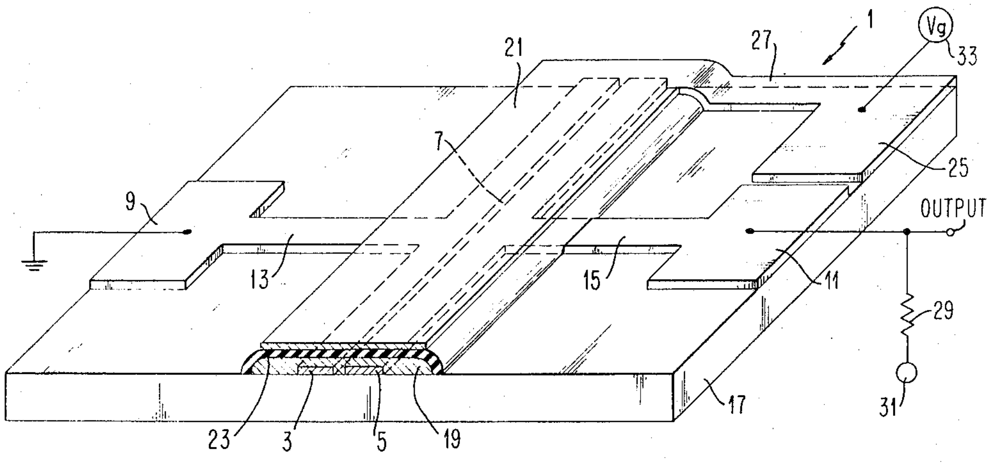
FIG. 1 is an isometric view of a thin film transistor device.

The structure of a thin film transistor 1 is illustrated in FIG. 1 as comprising a metallic source electrode 3 and a metallic drain electrode 5 defining a source-drain gap 7.

Source and drain electrodes 3 and 5 are formed in narrow parallel strips continuous with lands 9 and 11, respectively, along connecting strips 13 and 15, respectively. Source and drain electrodes 3 and 5 along with lands 9 and 11 and, also, connecting strips 13 and 15 are formed, for example, of gold (Au) and deposited in integral fashion onto a glass substrate 17. A thin layer 19 of wide-band gap semiconductor material, e.g., cadmium sulfide (CdS), is deposited over source and drain electrodes 3 and 5 and within source-drain gap 7. In effect, the thin layer 1 of cadmium sulfide, i.e., the active layer 19, electrically connects source and drain electrodes 3 and 5. A control gate electrode 21, insulated from active layer 19 by a thin film of dielectric material 23, e.g., silicon monoxide (SiO), calcium fluoride ($CaF_2$), etc., is registered with the source-drain gap 7 and continuous with land 25 along connecting strip 27. The particular geometry of source and drain electrodes 3 and 5 minimizes the area of control gate electrode 21 opposing source and drain electrodes 3 and 5 and, also, connecting strips 13 and 15 so as to substantially reduce input capacitance to within tolerable limits and also loosens registration tolerances during the fabrication process.

Active layer 19 of cadmium sulfide exhibits n-type characteristics such that majority carriers supporting conduction are free electrons. When connected in electrical circuit arrangement, source electrode 3 is connected to ground at land 9; drain electrode 5 is connected at land 11 and through a resistive load 29 to current source 31; and control gate electrode 21 is connected at land 25 to a source 33 of biasing voltages $V_g$. Dynamically, the source, control, gate, and drain electrodes are somewhat analogous to the cathodes, grid, and plate, respectively, of a conventional vacuum triode. The number of free electrons in active layer 19 and, therefore, conduction between source and drain electrodes 3 and 5 is a function of bias voltage $V_g$ on control gate electrode 21. In effect, active layer 19 and the control gate electrode 21 define the plates of a capacitor, control gate bias $V_g$ determining the majority carrier concentration, or charge, in active layer 19.

When residual carrier density $n_c$ in active layer 19 is reduced in accordance with this invention, (1) enhancement mode operation is achieved whereby useful source-drain current $I_{sd}$ is induced for low control gate bias $V_g$, (2) transconductance $g_m$ is increased, and (3) good "on-off" operation is obtained. In the description of the method for fabricating thin film transistor 1, components other than active layer 19 are deposited by standard vapor deposition techniques. With regard to active layer 19, the method includes the controlled compensation or purposeful introduction of impurity sites during or after the deposition process to control residual carrier density $n_c$. Since cadmium sulfide active layer 19 is polycrystalline, the normal residual carrier density $n_c$ is such that substantial source-drain current $I_{sd}$ flows at zero gate bias voltage $V_g$. When uncompensated, thin film transistor 1 would normally operate in a depletion mode and substantial negative control gate bias $V_g$ is required to reduce carrier density $n_c$ sufficiently to obtain "cut-off," i.e., $I_{sd}=0$.

Figure 3:
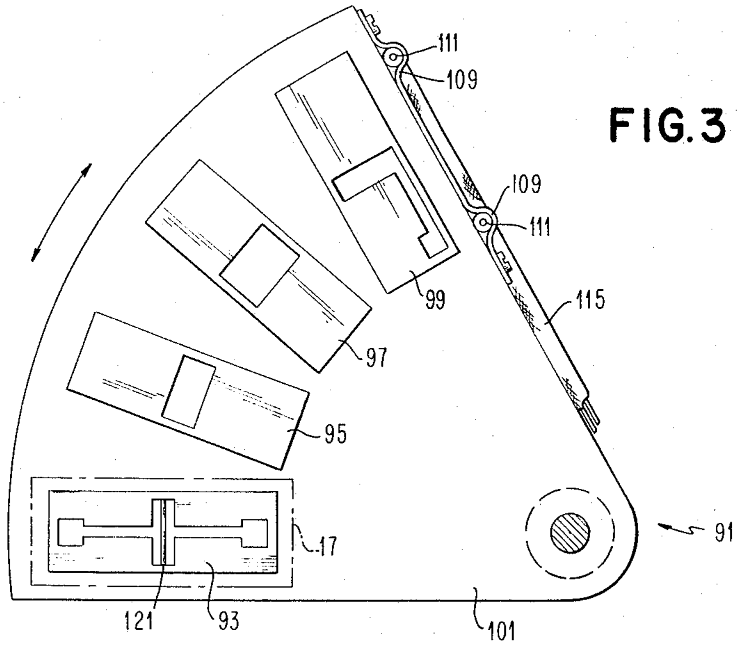
FIG. 3 is a view taken along the section 3—3 of FIG. 2 and illustrating a masking arrangement for fabricating the thin film transistor of FIG. 1.

The vacuum system illustrated in FIG. 3 for fabricating thin film transistors of the type shown in FIG. 1 comprises a low pressure chamber 35, the rim of which is received in an annular groove defined in rubber gasket 37. Rubber gasket 37 rests on base plate 39 and provides an effective vacuum seal to pressures in the order of $10^7$ Torr. Chamber 35 is evacuated along an exhaust port 41 by a high efficiency vacuum pump 43. Evaporation sources 45, 47, 49, and 51 are mounted in cluster-fashion on deck plate 53 supported on base plate 39 by insulating spacers 55. Evaporation sources 45, 47, 49, and 51 are aligned with substrate 17 supported in substrate holder 57. Active layer 19 is formed of cadmium sulfide vaporized in source 45; source, drain, and, also, control gate electrodes 3, 5, and 21 are formed of gold (Au) vaporized in source 47; also, insulating layer 23 is formed of silicon monoxide (SiO) vaporized in source 49. In accordance with further aspects of this invention, source 51 is provided for vaporizing a dopant material to purposefully introduce impurity sites into active layer 19. When active layer 19 is formed of n-type semiconductor material, dopant material vaporized in source 51 is chosen to be an electron acceptor, e.g., for n-type CdS an element from Group I of the periodic table, i.e., gold, copper, etc.; conversely, when active layer 19 is formed of p-type semiconductive material, dopant material is chosen, for example, from Group III of the periodic table.

The evaporating sources 45 through 51 are of the Drumheller type and comprise an inner screen cylinder 58 positioned axially within a nonperforated crucible 59 by a lower annular spacer 61 and an annular cap 63. Also, screen cylinder 58 and crucible 59 are positioned within a resistance heater 65. The particular evaporant material, e.g., CdS, SiO, Au, etc., is loaded between screen cylinder 58 and crucible 59; volatilized evaporant passes through screen cylinder 58 and upwardly along the chimney defined therealong to deposit onto substrate 17. A thermocouple junction 67 is positioned in the evaporant stream along screen cylinder 58 to determine evaporant temperature; thermocouple wires 69 are connected to temperature meter 71 through base plate 39. Also, opposite terminals of resistance heaters 65 are connected to temperature regulators indicated within dotted enclosures 75 along leads 73. Each temperature regulator 75 comprises a step-down transformer 77 having a secondary winding electrically connected at the lower exposed ends of leads 73, respectively. The primary winding of transformer 77 is connected along a variable inductance 79 which, in turn, is connected to an alternating voltage source 81. Variable inductance 79 controls electrical energy supplied to the respective resistance heater 63 so as to establish a predetermined source temperature which is indicated by temperature meter 71.

A baffle 83 is positioned intermediate evaporation sources 45 through 51 and substrate 17 to intercept the evaporant stream. Baffle 83 is mounted on connecting rod 85 supported in bearing arrangement 87 and connected to control knob 89 disposed exterior to vacuum chamber 35. While an evaporation source is being elevated to a predetermined temperature, baffle 83 intercepts vapors passing upwardly toward substrate 17 to insure uniform depositant composition. When the predetermined source temperature has been attained, baffle 83 is displaced from over substrate 17 to expose substrate 17 to the evaporant stream from the individual sources 45 through 51.

Interposed between baffle 83 and substrate 17 is a masking arrangement 91 (see also FIG. 3) for stenciling patterns of evaporant materials from evaporation sources 45 through 51 onto substrate 17. Masking arrangement 91 includes a source-drain mask 93, an active layer mask 95, an insulation mask 97, and a gate mask 99 supported in radial-fashion on a fan-shaped mask carrier 101. Mask carrier 101 is supported in horizontal fashion on connecting rod 103. Connecting rod 103 extends to control knob 105 disposed exterior to vacuum chamber 35 and is rotatably supported in bearing arrangement 107. Pattern masks 91 through 99 are selectively positioned in turn over substrate 17 by rotation of control knob 105 to form particular evaporant patterns on substrate 17. In addition, connecting rod 103 includes recesses 108 which mate with spring-pressed detent 109 within bearing arrangement 107 for supporting mask carrier 101 in parallel, horizontal planes, as hereinafter described. Also, a pair of electrical probes 111 are supported along a radial edge of mask carrier 101 by bracket member 113 so as to be aligned with portions of source-drain masks 93 defining lands 9 and 11. Probes 111 are connected along leads 115 which pass through base plate

39 and are connected through current meter 117 to current source 119. In the doping process, reduction of residual carrier density $n_c$ increases the resistance of active layer 19. Accordingly, the doping level is monitored by contacting probes 111 to lands 9 and 11, respectively, to ascertain the resistance of active layer 19 as indicated by meter 117.

Briefly, thin film transistor 1 of FIG. 1 is fabricated by selectively positioning masks 93 through 99 in turn over substrate 17 to intercept selected portions of the evaporant stream directed upwardly from the individual evaporation sources. With respect to source-drain pattern mask 93, minimization of the source-drain gap 7 is achieved by a wire or grill-type mask wherein the gap 7 is defined by a thin wire 121 stretched across the transverse leg of the pattern outline. Because of the extremely small dimensions of gap wire 121, e.g., 7 microns, the source-drain masks 93, i.e., the gap wire 121, is placed in direct contact with substrate 17 during deposition of source and drain electrodes 3 and 5. The reason is obvious if one considers that, even at the reduced system pressures, some scattering of cadmium sulfide evaporant and, also, some flow of depositant on the substrate does occur. Contacting of gap wire 121 with substrate 17 during the deposition process insures a source-drain gap 7 of constant, thin dimensions and, also, substantially reduces the possibility of electrical shorts between the source and drain electrodes 3 and 5.

During the fabrication process, chamber 35 is initially evacuated by vacuum pump 43, say, to $10^{-6}$ mm. Hg, and mask carrier 101 is rotated by control knob 105 to position source-drain mask 93 over the substrate 17; also, control knob 105 is forced upwardly to cause detent mechanism 109 to engage connecting rod 103 whereby gap wire 121 contacts substrate 17. The appropriate temperature regulator 75 is operated to elevate evaporation source 47 in excess of the vaporization temperature of the gold evaporant. When this source temperature is obtained, baffle 83 is rotated by control knob 89 to expose substrate 17 for a time sufficient to deposit an electrically-continuous source 3-drain 5 pattern; the thickness of the source-drain pattern can be determined by appropriate instrumentation techniques known in the art. At this time, baffle 83 is returned to prevent further deposition while evaporation source 47 is cooled.

The active layer 19, the insulating layer 23 and the control gate electrode 21 are deposited in turn by successively elevating sources 45, 49, and 47 while mask carrier 101 is positioned to locate corresponding pattern masks 95, 97, and 99, respectively, over substrate 17. With respect to the deposition of active layer 19, however, impurity sites are introduced into active layer 19 by exposing the evaporant during deposition to a gaseous dopant or by evaporating impurity-introducing material either concurrently with or subsequent to the semiconductor material forming active layer 19. When the impurity-introducing material is evaporated subsequent to the semiconductor material, heat treatment is effective to cause such material to diffuse into active layer 19, as hereinafter described. To this end, a substrate heater 123 is provided which is connected to a variable current source 125 along leads 127 extending through base plate 39.

To appreciate the deposition of active layer 19, consider that the semiconductor evaporant, e.g., cadmium sulfide, when vaporized disassociates in accordance with the reaction $2CdS \rightarrow 2Cd + S_2$ whereby free cadmium (Cd) and sulfur ($S_2$) atoms pass upwardly toward substrate 17. Cadmium atoms deposited on substrate 17 are chemically unsaturated, the quantity of free cadmium being a function of temperature of evaporation source 45. A portion of free cadmium atoms does recombine with free sulfur atoms on the surface of substrate 17, i.e., $2Cd + S_2 \rightarrow 2CdS$. Unsaturated cadmium atoms, however, each contribute a pair of free carriers, i.e., electrons, to the conduction band and, thus, increase the residual carrier density $n_c$.

In accordance with one aspect of this invention, the residual carrier density $n_c$ is reduced by depositing active layer 19 in a reactive gaseous atmosphere. To this end, a predetermined partial pressure of gaseous dopant is introduced in chamber 35 along port 119 prior to the deposition of active layer 19. When active layer 19 is formed of n-type material, e.g., cadmium sulfide, the gaseous dopant is selected to compensate for anion vacancies; such dopant can be selected from Group VI of the periodic table, e.g., oxygen, sulfur, selenium or any divalent anion which will substitutionally act as $S^{=}$. Conversely, when active layer 19 is formed of p-type material, e.g., lead sulfide, the gaseous dopant is again selected from Group VI to compensate for anion vacancies. For example, when cadmium sulfide is evaporated in an oxygen atmosphere introduced from gaseous source 131 along input port 129, deposition of free cadmium atoms is effected in both a sulfur ($S_2$) and an oxygen ($O_2$) atmosphere. The free cadmium atoms combine with both the sulfur and oxygen atoms on substrate 17 so that each cadmium atom satisfied by the oxygen dopant reduces the residual carrier concentration $n_c$ in active layer 19.

Figure 2:
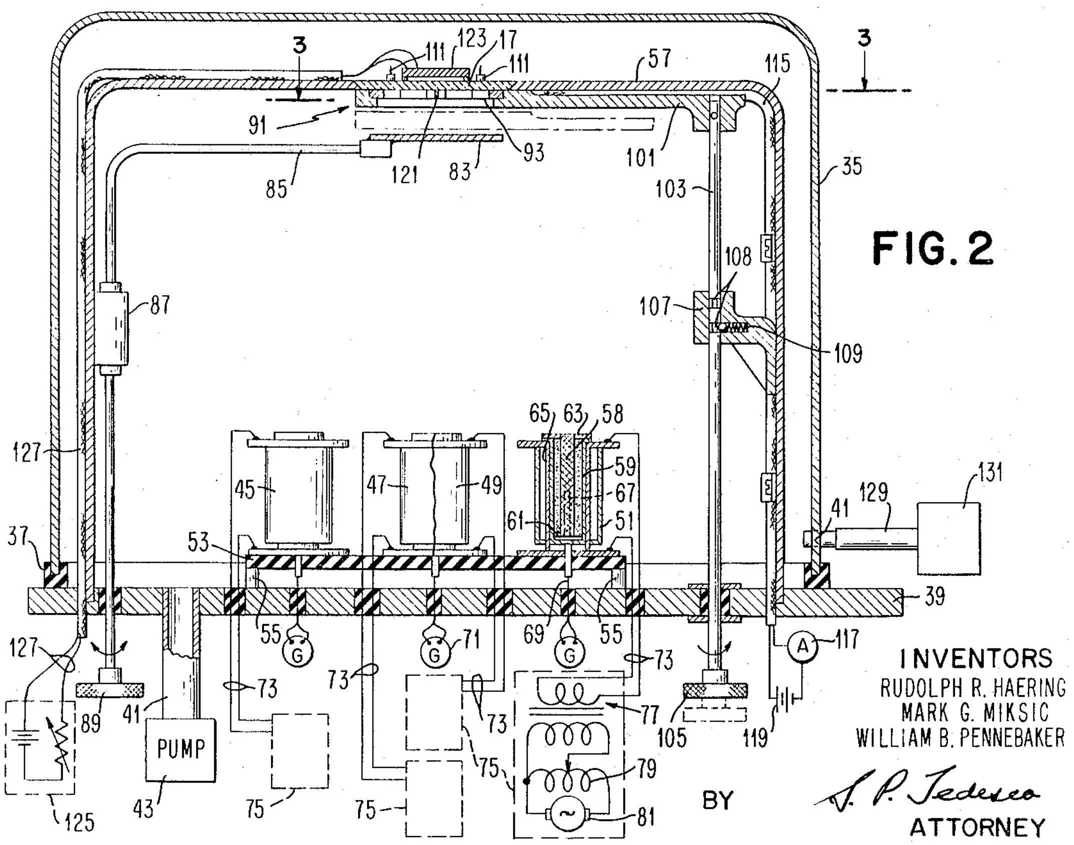
FIG. 2 is an axial view of a vacuum system which can be used to fabricate the thin film transistor device of FIG. 1.

Alternatively, residual carrier density $n_c$ in active layer 19 is reduced by introducing impurities, either donor or acceptor-type, into active layer 19. As illustrated in FIG. 2, the impurity-introducing, or dopant, materials are evaporated in source 51. When a predetermined amount of dopant material has been evaporated onto active layer 19, the active layer is heated by heater 123 to a temperature sufficient to cause such dopant material to diffuse into the semiconductor material. If desired, the dopant and semiconductor materials can be evaporated concurrently from a single evaporation source of the type shown or, alternatively, by known sputtering techniques. As above, the dopant material is selected to introduce impurity sites which have an affinity for majority carriers in active layer 19. For example, when active layer 19 is formed of n-type cadmium sulfide or lead sulfide, acceptor dopants are selected from Group I–*b* elements; conversely, Group V–*a* elements are selected when active layer 19 is formed of p-type lead sulfide.

As described, the resistance of active layer 19, being a function of residual carrier density $n_c$, can be measured to monitor the doping process. The resistance of partially-formed active layer 19 is periodically measured by swinging mask carrier 101 while in a lowered detented position to sweep probles 108 over lands 9 and 11, respectively; at this time, baffle 83 has been rotated to shield substrate 17. The resultant current flow between probes 108 and along the partially-formed active layer 19 provides a precise indication of the resistance of active layer 19 as indicated by meter 121. For example, if the resistance of partially-formed active layer 19 can be controlled by proper regulation of the dopant partial pressure in chamber 35 by vacuum pump 43 so to control the concentration of free cadmium atoms in subsequently-deposited portions of active layer 19. Also, additional impurity-introducing material can be diffused into active layer 19.

The results of the method of this invention can be expressed in terms of the transconductance $g_m$ of thin film transistor 1 which is defined as $$C\mu V_{sd}/L^2[dn_c/dn+B(dn_t/dn)]$$

Figure 6A:
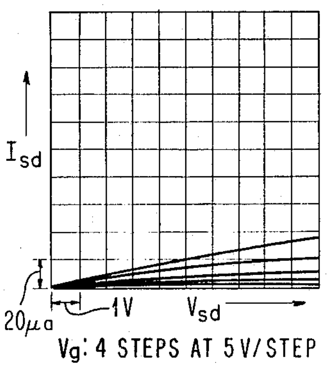

In the above expression, C is the input capacitance, $\mu$ is carrier mobility, $V_{sd}$ is the source-drain voltage, L is the source-drain gap 7 and B is the sensitivity of mobility to carrier concentration. Further, the quantity $dn_c/dn$ indicates the fraction of additional carriers in active layer 19 entering into the conduction band due to control gate bias; on the other hand, the expression $dn_t/dn$ indicates the fraction of additional carriers due to control gate bias which are absorbed by trap levels above the Fermi-level present in active layer 19. If the total number of additional carriers flowing in active layer 19 due to control gate bias is represented by $dn$, the expression is made that $dn=dn_c+dn_t$. Thus, it follows that the ratio $\Delta n_c/n_c$ and, also, the transconductance $g_m$ are increased when the quantity $dn_c$ predominates in the above expression. Quantity $dn_c$ predominates when a large portion of the additional carriers enter into the conduction band; accordingly, useful source-drain currents $I_{sd}$ are obtained for low values of control gate bias. On the other hand, quantity $dn_t$ predominates when active layer 19 is overdoped. As illustrated in FIG. 6*a*, excessive values of control gate bias are required to draw useful source-drain current $I_{sd}$. Since the doping level of active layer 19 determines quantity $dn_c$, it is also determinative of the operating characteristics of thin film transistor 1.

Figures 4B, 5B, 6B:
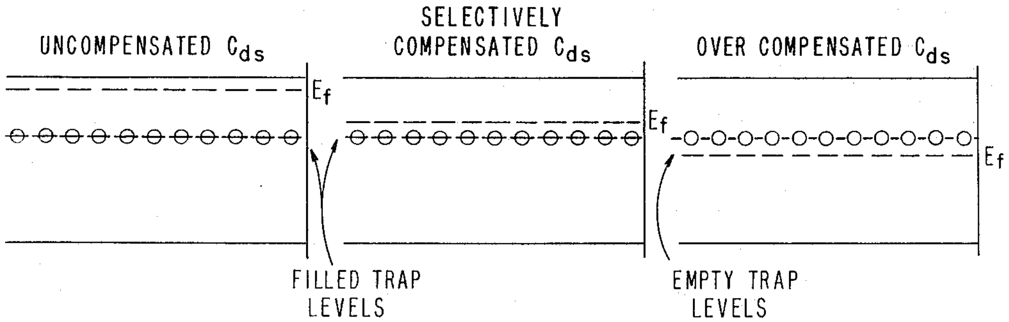
Figure 4A:
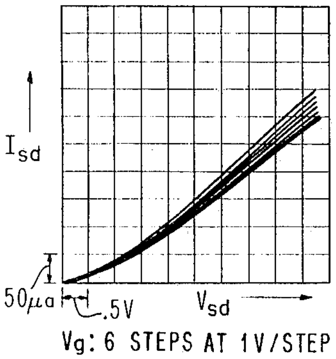
Figure 5A:
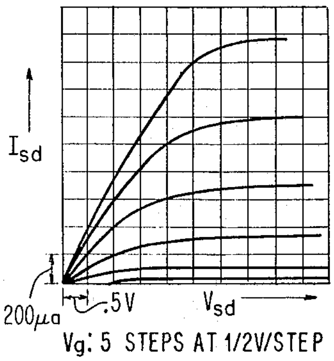

The effect of impurity sites in active layer 19 of thin film transistor 1 can be more fully appreciated upon consideration of FIGS. 4*b*, 5*b*, and 6*b* which illustrate energy band pictures for zero control gate bias at the active layer 19-insulator 23 interface for an undoped or uncompensated, a selectively compensated, and an overcompensated active layer 19, respectively. Although the traps are shown as distributed in the volume of the semiconductor material, it is quite possible that such traps are located at the surface or at the grain boundaries. In addition, corresponding source-drain current $I_{sd}$-source-drain voltage $V_{sd}$ characteristic curves are illustrated in FIGS. 4*a*, 5*a*, and 6*a*, respectively.

When active layer 19 is formed of cadmium sulfide, carrier concentration $n_c$ is in the range of $10^{15}$ to $10^{16}$ electrons per cubic centimeter. The presence of free carriers defines a conductive state for active layer 19 at zero control gate bias voltage. Normally, for an undoped or underdoped semiconductor as illustrated in FIG. 4*b*, a number of unidentified trap levels are present in the region below the Fermi-level $E_f$; these trap levels when unfilled exhibit large scattering cross-sections and, accordingly, limit carrier mobility $\mu$ in active layer 19. In FIGS. 4*b*, 5*b*, and 6*b*, filled trap levels have been indicated by $\theta$ and unfilled trap levels have been indicated by O. Thus, when carrier concentration $n_c$ of active layer 19 is reduced, either by compensation or doping as hereinabove described, the ratio $\Delta n/n_c$, actual transconductance $g_m$ and, also, modulation efficiency may be reduced due to these trap levels being uncovered by lowering of the Fermi-level $E_f$ as illustrated in FIGS. 5*b* and 6*b*. These uncovered trap levels tend to act as a sink for carriers introduced into active layer 19 by action of control gate electrode 21. Thus, the fraction of these carriers thus introduced which contribute to the change in carrier concentration $\Delta n_c$, i.e., $dn_c$, and which are absorbed at these uncovered trap levels, i.e., $dn_t$, is determined by the degree of compensation or doping of active layer 19. Thus, active layer 19 should nat be overdoped so as to lower the Fermi-level $E_f$ sufficiently to uncover many unfilled traps, as illustrated in FIG. 6*b*. To achieve optimum characteristics, i.e., a large ratio of $\Delta\sigma/\sigma$ and high carrier mobility $\mu$, selective compensation or doping of active layer 19 should establish the Fermi-level $E_f$ just above those trap levels absorptive of carriers induced by source-drain voltage $V_{sd}$ so as to reduce residual carrier density $n_c$. The resulting source-drain current $I_{sd}$-source-drain voltage $V_{sd}$ characteristic curves are illustrated in FIG. 5*a*. If on the other hand, active layer 19 is overcompensated or overdoped, the Fermi-level $E_f$ is reduced so as to present an excessive number of unfilled trap levels as illustrated in FIG. 6*b*. In such event, a large portion of carriers induced in active layer 19 are absorbed by these unfilled traps and excessive control gate bias $V_g$ is required to obtain useful source-drain current $I_{sd}$. As illustrated in FIG. 6*a*, the source-drain current $I_{sd}$-source-drain voltage $V_{sd}$ characteristic curves are compressed with respect to those of FIG. 5*a* for equal magnitudes of control gate bias voltage $V_g$. Accordingly, in accordance with this invention, the characteristics of thin film transistor 1 can be continuously varied as indicated in FIGS. 4*b*, 5*b*, and 6*b* by proper regulation of the degree of compensation or doping of active layer 19. It is evident that the characteristics illustrated in FIG. 5*b* are preferred.

The introduction of $O_2$, $S_2$ or any other divalent ion into the lattice structure at a vacant S site without radically altering the band structure will, to first order, effect only the Fermi-level $E_f$. The term "compensation" has been used to describe such effects since a sulfur vacancy, normally acting as a shallow donor, is eliminated by the incorporation of the divalent ion. When impurity-introducing material, e.g., gold, copper, silver, etc., is introduced into active layer 19, the Fermi-level $E_f$ is again adjusted to maximize $\Delta\sigma/\sigma$. The Fermi-level $E_f$ is positioned such that, at zero control gate bias, deep trap levels are "buried" and the number of residual carriers $n_c$ in active layer 19 is still substantially eliminated. The Fermi-level $E_f$ should not be established, i.e., active layer 19 overdoped, so as to uncover the deeper slow traps which would require excessive control gate bias voltages to induce a useable source-drain current $I_{sd}$. This latter condition is indicated in the curves of FIG. 6*b*. This latter technique differs from the compensation technique in that the number of crystalline defects in active layer 19 is increased so as to provide additional deep traps. The deep traps, in effect, empty the shallow donor states to reduce residual carrier concentration $n_c$.

While the invention has been particularly shown and described with reference to preferred embodiments thereof, it will be understood by those skilled in the art that various changes in form and details may be made therein without departing from the spirit and scope of the invention.

What is claimed is:

A process for fabricating thin film transistors by vapor deposition techniques comprising the steps of forming metallic source and drain electrodes defining a source-drain gap onto a substrate, vapor depositing a semiconductor compound material selected from the group consisting of cadmium sulphide and lead sulphide within said source-drain gap to define an active layer and electrically connect said source and drain electrodes, forming an insulating layer over said active layer, and forming a gate electrode over said insulating layer in field-applying relationship with said active layer, the improvement comprising the steps of vapor depositing said semiconductor compound material within said source-drain gap in a chamber containing a reactive atmosphere selected from the group consisting of oxygen and sulphur in amounts effective to compensate for sulphur vacancies in said active layer, and establishing the partial pressure of said gaseous atmosphere to reduce residual carrier density $n_c$ in said active layer.

References Cited by the Examiner

UNITED STATES PATENTS

| | | | |
|---|---|---|---|
| 2,820,841 | 1/1958 | Carlson et al. | 148—174 |
| 2,921,905 | 1/1960 | Chang | 23—204 |
| 2,994,621 | 8/1961 | Hugle et al. | 148—174 |
| 3,092,591 | 6/1963 | Jones et al. | 252—62.3 |
| 3,162,556 | 12/1964 | Ravich | 148—174 |
| 3,179,541 | 4/1965 | Hull et al. | 23—204 |

DAVID L. RECK, *Primary Examiner.*

N. F. MARKVA, *Assistant Examiner.*